United States Patent
Thakur et al.

[19]
[11] Patent Number: 6,162,666
[45] Date of Patent: Dec. 19, 2000

[54] METHOD TO FORM A DRAM CAPACITOR USING LOW TEMPERATURE REOXIDATION

[75] Inventors: Randhir P. S. Thakur; Brett Rolfson, both of Boise, Id.

[73] Assignee: Micron Technology, Inc, Boise, Id.

[21] Appl. No.: 09/368,481

[22] Filed: Aug. 4, 1999

Related U.S. Application Data

[62] Division of application No. 08/968,382, Nov. 12, 1997, Pat. No. 5,966,595, which is a continuation of application No. 08/539,809, Oct. 5, 1995, abandoned.

[51] Int. Cl.$^7$ .................. H01L 21/00; H01L 21/8242; H01L 21/20; H01L 21/31; H01L 21/469
[52] U.S. Cl. .................. 438/164; 438/151; 438/788; 438/396; 438/253
[58] Field of Search .................. 438/151, 164, 438/788, 396, 253

[56] References Cited

U.S. PATENT DOCUMENTS

| | | | |
|---|---|---|---|
| 5,322,809 | 6/1994 | Moslehi | 437/41 |
| 5,434,109 | 7/1995 | Geissler et al. | 437/239 |
| 5,510,158 | 4/1996 | Hiramoto | 427/582 |
| 5,523,596 | 6/1996 | Ohi | 257/296 |
| 5,597,754 | 1/1997 | Lou | 437/52 |
| 5,622,607 | 4/1997 | Yamazaki et al. | 438/788 |
| 5,840,600 | 11/1998 | Yamazaki et al. | 438/151 |
| 5,973,911 | 10/1999 | Nishioka | 361/313 |

*Primary Examiner*—John F. Niebling
*Assistant Examiner*—Jennifer M. Kennedy

[57] ABSTRACT

An embodiment of the present invention teaches a capacitor dielectric in a wafer cluster tool for semiconductor device fabrication formed by a method by the steps of: forming nitride adjacent a layer by rapid thermal nitridation; and subjecting the nitride to an ozone ambient, wherein the ozone ambient is selected from the group consisting of an ambient containing an the presence of ultraviolet light and ozone gas, an ambient containing an ozone gas or an ambient containing an $NF_3$/ozone gas mixture.

14 Claims, 3 Drawing Sheets

STEP 1: (OPTIONAL)

DIELECTRIC DEPOSITION VIA RAPID THERMAL PROCESSING

STEP 2:

DIELECTRIC REOXIDATION IN AN OZONE AMBIENT

METHOD TO FORM A DRAM CAPACITOR USING LOW TEMPERATURE REOXIDATION

This application is a divisional to U.S. patent application Ser. No. 08/968,382, filed Nov. 12, 1997, now U.S. Pat. No. 5,966,595, which is a continuation to U.S. patent application Ser. No. 08/539,809, filed Oct. 5, 1995 also abandoned.

FIELD OF THE INVENTION

This invention relates to semiconductor fabrication and particularly to a dielectric material formed from a reoxidized high dielectric constant material and a process to create same.

BACKGROUND OF THE INVENTION

Dielectric materials used in semiconductors are selected depending on the intended use. For example, in the dynamic random access memory (DRAM) device, storage cells require a storage capacitor as a means of storing a charge to represent data. It is usually therefore desirable to select a dielectric material that possesses a high dielectric constant in order to prevent charge leakage. This is even more desirable, as DRAM devices become more densely packed, to contain more bit storage capability per die than early generations.

Many capacitor dielectrics have been utilized in attempts to shrink capacitor size and still maintain sufficient charge storage capability. Some examples include, thin film nitrides, oxide/nitride combinations or ferroelectric materials to name a few. However, each of these dielectric films possess limitations, thus forcing ongoing research to find the ideal capacitive dielectric film.

The present invention develops a very promising capacitive dielectric film by special reoxidation techniques which will come apparent to one skilled in the art from the following disclosure.

SUMMARY OF THE INVENTION

One embodiment of the present comprises a method for oxidizing a dielectric for semiconductor device fabrication, by subjecting the dielectric to an ozone ambient, wherein the ozone ambient is selected from the group consisting of an ambient containing the presence of ultraviolet light and ozone gas; an ambient containing an ozone or an ambient containing an $NF_3$/ozone gas mixture.

Another embodiment of the present invention comprises a method for forming a dielectric in a wafer cluster tool for semiconductor device fabrication by the steps of:

forming nitride adjacent a layer by rapid thermal nitridation;

subjecting the nitride to an ozone ambient, wherein the ozone ambient is selected from the group consisting of an ambient containing an the presence of ultraviolet light and ozone gas; an ambient containing an ozone or an ambient containing an $NF_3$/ozone gas mixture.

DETAILED DESCRIPTION OF THE INVENTION

Figure 1:
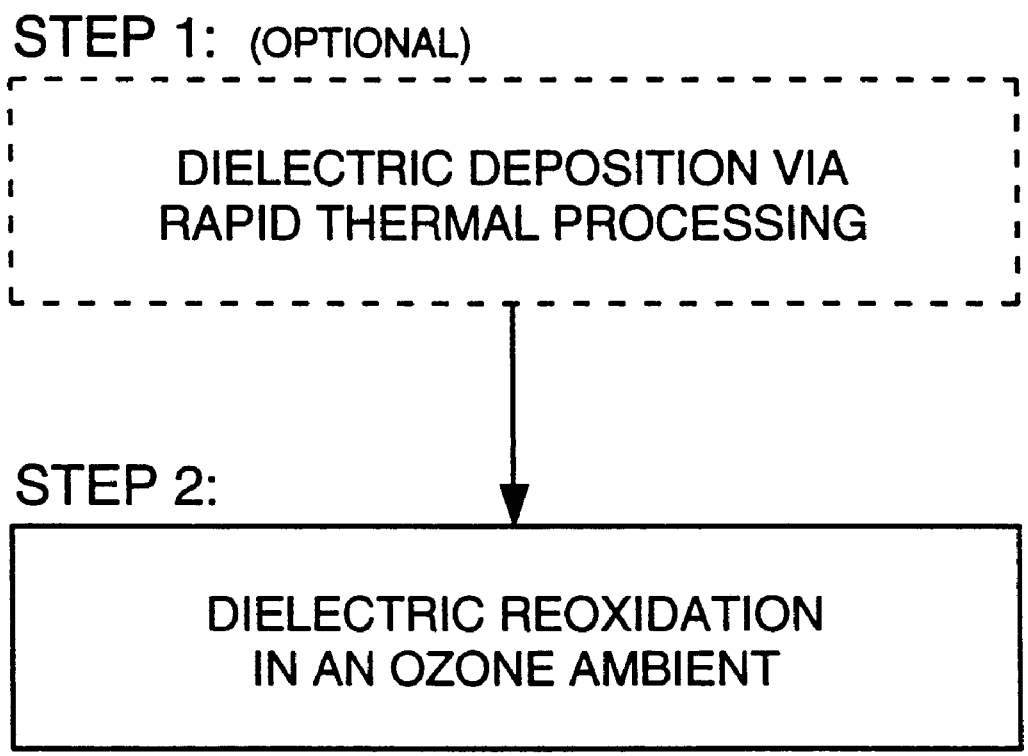
FIG. 1 shows process steps to form the dielectric material of the present invention.
Figure 2:
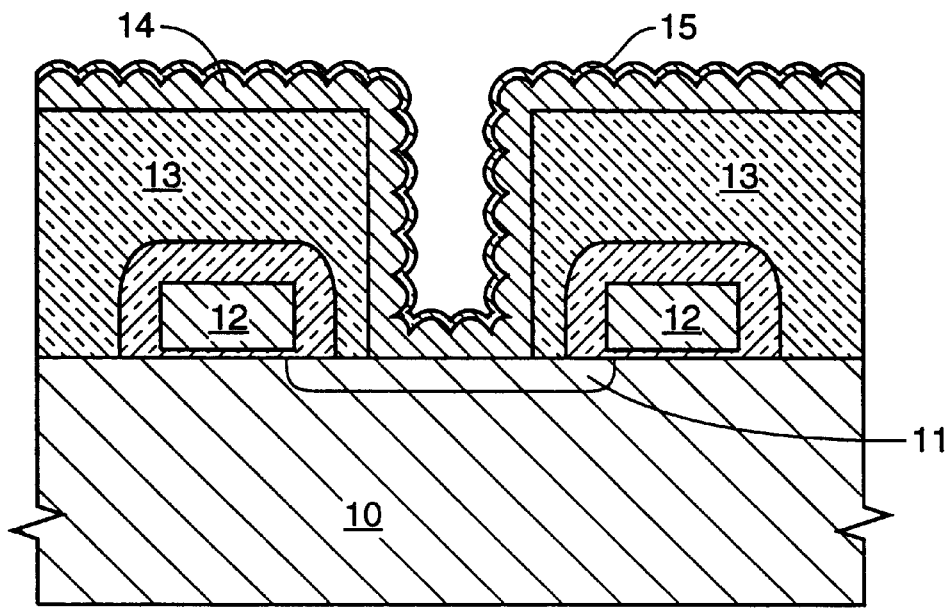
FIGS. 2–4 show the process steps of FIG. 1 as specific implementations of the dielectric material of the present invention.
Figure 3:
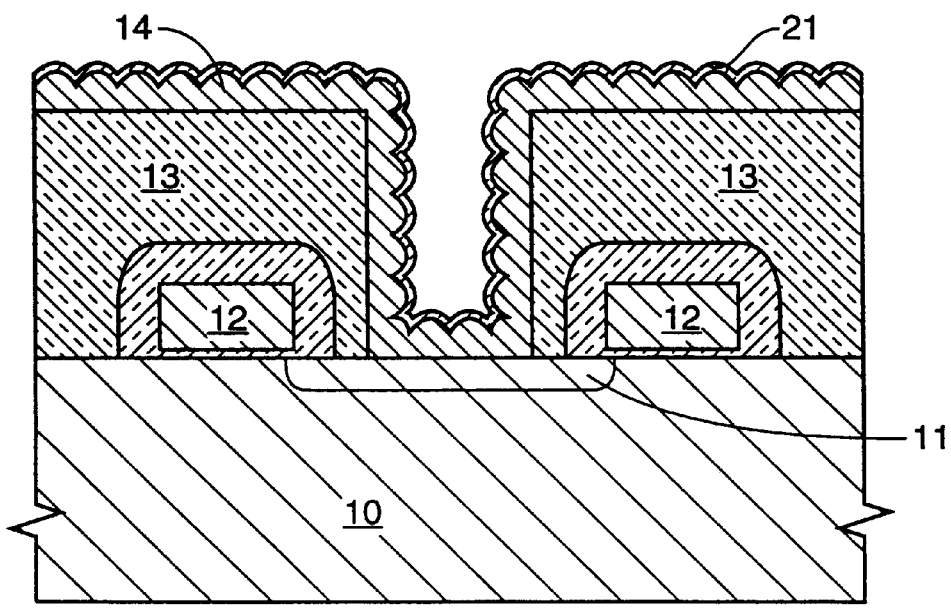
Figure 4:
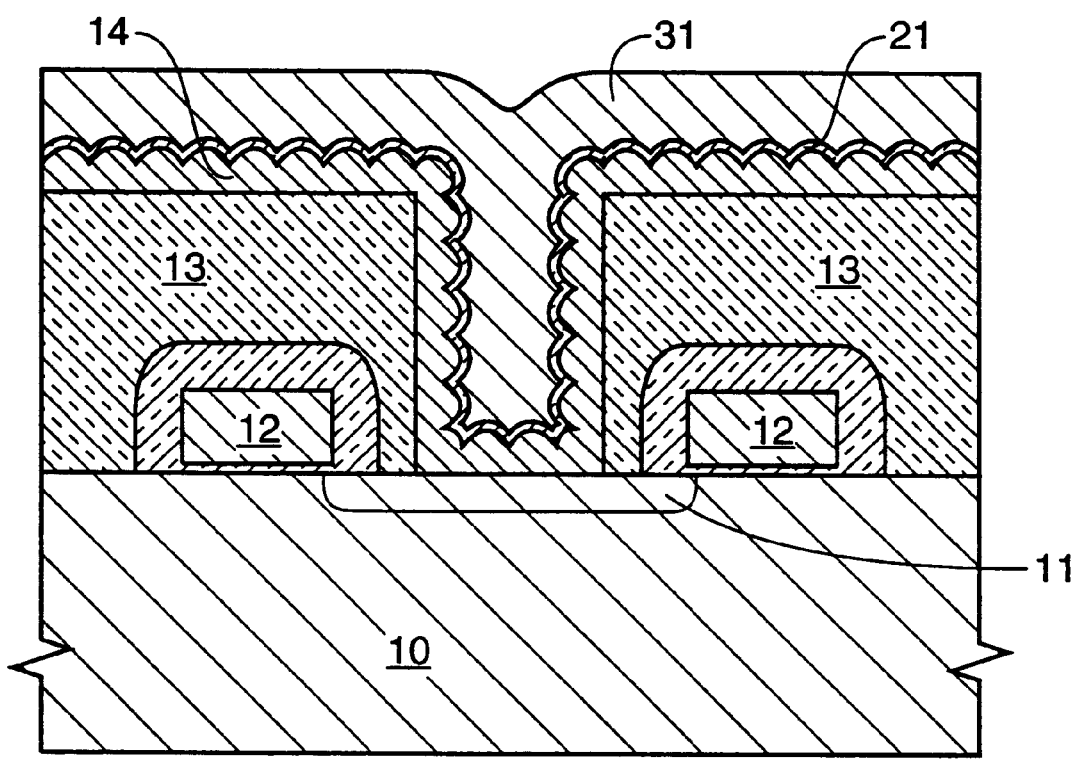

Embodiments of the present invention are depicted in the process flow chart of FIG. 1. Results of the process steps of a specific embodiments are depicted in FIGS. 2–4, as will be appreciated by one skilled in the art from the following description of the invention.

Referring now to the process flow chart of FIG. 1, during optional step 1, a dielectric deposition step (for example to form a capacitor cell dielectric) is performed via rapid thermal nitridation (RTN) processing to form a nitride over the top of an existing material (i.e., a capacitor cell plate). It is preferred to perform the RTN step using the processing parameters under the following conditions: the RTN is performed at a temperature ranging from 600° C.–1200° C. (900° C.–1000° C. is preferred) and for a time period ranging from 5 sec–60 sec (20 sec–60 sec is preferred).

Taking a specific example of forming a capacitor cell dielectric, forming the RTN nitride is preferred, but optional, as the cell dielectric may be formed by any process, as a significant reoxidation of the cell dielectric (regardless of material or how it is formed) is performed in step 2. Though nitride is the preferred dielectric, other dielectrics that possess a dielectric constant of at least 3, such as BST, $Y_2O_3$, $TiO_2$, or polyimides, may also be used. During step 2, the cell dielectric is exposed to an ozone ambient using three preferred options which include:

(1) exposing the dielectric to an ambient containing ozone gas with the ambient controlled at a temperature of at least 600° C.;

(2) exposing the dielectric to an ambient containing an a presence of ultraviolet light and ozone gas with the ambient controlled at a temperature less than 500° C.; and (3) exposing the dielectric an ambient containing an $NF_3$/ozone gas mixture with the ambient controlled at a temperature of at least 500° C. In the third option, using Ar or $N_2$ as a carrier gas for the $NF_3$/ozone gas mixture will further enhance the reoxidation of the dielectric. Any three of the options listed above may be performed in a wafer cluster tool.

A preferred method using a wafer cluster to for semiconductor device fabrication, comprises the steps of:

forming nitride adjacent a layer by rapid thermal nitridation; and subjecting the nitride to an ozone ambient, wherein the ozone ambient is selected from the any one of the three options which are: (1) an ambient containing an the presence of ultraviolet light and ozone gas; and, (2) an ambient containing an ozone gas, or (3) an ambient containing an $NF_3$/ozone gas mixture.

A specific embodiment of the present invention to fabricate a storage capacitor for a memory device, such as for a DRAM or floating gate device, is depicted in FIGS. 2–4. Referring now to FIG. 2, word lines 12 have been formed and patterned over silicon substrate 10. A diffusion area 11 has been implanted into substrate 10, which spans between word lines 12. A planarized insulation material 13, such as borophosphosilicate glass (BPSG) has been formed over word lines 12 and also has been etched to provide access to diffusion area 11. A conductively doped polysilicon layer 14 conforms to the patterned surface of material 13 and makes contact to diffusion area 11. It is preferred that this polysilicon layer be rugged polysilicon (though not necessary) and it is further preferred that the rugged polysilicon be formed by in-situ vacuum anneal.

Next, a cell dielectric 15 is formed that conforms to polysilicon layer 14. It is important that dielectric 15 possess a dielectric constant of at least 3, which would include dielectric materials such as nitride, BST, $Y_2O_3$, $TiO_2$, or polyimides.

Referring now to FIG. 3, the dielectric material is reoxidized to form an oxidized dielectric 21 by one of the three options listed above, which again are:

(1) exposing the dielectric to an ambient containing an ozone gas with the ambient controlled at a temperature of at least 600° C.;

(2) exposing the dielectric to an ambient containing an the presence of ultraviolet light and ozone gas; with the ambient controlled at a temperature less than 500° C.; or (3) exposing the dielectric to an ambient containing an $NF_3$/ozone gas mixture with the ambient controlled at a temperature of at least 500° C. In the third option, using Ar or $N_2$ as a carrier gas for the $NF_3$/ozone gas mixture will further enhance the reoxidation of the dielectric.

In a preferred embodiment, though the dielectric 14 of FIG. 2 may be formed by any conventional method it is preferred that the dielectric comprise nitride that is formed in a wafer cluster tool for semiconductor device fabrication, by rapid thermal nitridation (RTN). After the nitride is formed (regardless of what method is used to form the nitride dielectric) the nitride dielectric is subjected to an ozone, wherein the ozone ambient is selected from the group consisting of an ambient containing an the presence of ultraviolet light and ozone gas, an ambient containing an ozone, or an ambient containing an $NF_3$/ozone gas mixture. The result is that the nitride dielectric material becomes reoxidized to form an oxidized dielectric 21.

As before, layer 14 comprises polysilicon (preferably rugged polysilicon formed by in-situ vacuum anneal). Though it is preferred that the rugged polysilicon be formed by in-situ vacuum anneal, the rugged polysilicon may also be formed ex-situ, though it is desirable that the rugged polysilicon be vapor precleaned (or precleaned in some manner) prior to rapid thermal nitridation.

Referring now to FIG. 4, a completed storage capacitor is formed by the addition of capacitor electrode 31 formed of a conductive material typically used in capacitor fabrication.

It is to be understood that although the present invention has been described with reference to a preferred embodiment, various modifications, known to those skilled in the art, may be made to the process steps presented herein without departing from the invention as recited in the several claims appended hereto. For example, all temperature ranges and time period ranges listed are not intended to be limited to the stated ranges but are instead intended to include all temperatures and times assumed therein, as well as all temperatures ranges and times period ranges assumed therein. Also, the capacitive dielectric material of the present invention may be used in any capacitive type device and in particular in storage capacitors used in memory devices or in storage elements used in floating gate devices.

What is claimed is:

1. A method for oxidizing a capacitor dielectric for semiconductor device fabrication, said method comprising subjecting said capacitor dielectric to an ozone ambient by presenting a gas consisting of ozone gas to said capacitor dielectric and exposing said capacitor dielectric to ultraviolet light, wherein said capacitor dielectric is a dielectric selected from the group consisting of BST, $Y_2O_3$, $TiO_2$, or polyimide.

2. The method of claim 1, wherein said capacitor dielectric possesses a dielectric constant of at least 3.

3. The method of claim 1, wherein said ozone ambient is controlled at a temperature of at least 600° C.

4. The method of claim 1, wherein said ozone ambient is controlled at a temperature less than 500° C.

5. The method of claim 1, wherein $NF_3$ gas is added to said ozone ambient to form an $NF_3$/ozone gas mixture which is controlled at a temperature of at least 500° C.

6. The method of claim 5, wherein said $NF_3$/ozone mixture further comprises the addition of Ar or $N_2$.

7. A method for forming a capacitor dielectric in a wafer cluster tool for semiconductor device fabrication, said method comprising the steps of:

forming nitride adjacent a layer by rapid thermal nitridation;

subjecting said nitride to an ozone ambient by presenting a gas consisting of ozone gas to said nitride and exposing said nitride to ultraviolet light.

8. The method of claim 7, wherein said ozone ambient is controlled at a temperature of at least 600° C.

9. The method of claim 7, wherein said ozone ambient is controlled at a temperature less than 500° C.

10. The method of claim 7, wherein an $NF_3$ gas is added to said ozone ambient and $NF_3$/ozone gas mixture which is controlled at a temperature of at least 500° C.

11. The method of claim 10, wherein said $NF_3$/ozone gas mixture further comprises the addition of Ar or $N_2$.

12. The method of claim 7, wherein said layer comprises polysilicon.

13. The method of claim 12, wherein said polysilicon is formed by in-situ vacuum anneal.

14. The method of claim 12, wherein said polysilicon is formed ex-situ prior to rapid thermal nitridation.

* * * * *